United States Patent
Shimomura et al.

(10) Patent No.: US 12,363,984 B2
(45) Date of Patent: Jul. 15, 2025

(54) TRENCH-GATE POWER MOSFET WITH BURIED FIELD PLATES

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Saya Shimomura, Komatsu Ishikawa (JP); Hiroaki Katou, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 290 days.

(21) Appl. No.: 17/406,473

(22) Filed: Aug. 19, 2021

(65) Prior Publication Data

US 2022/0077293 A1   Mar. 10, 2022

(30) Foreign Application Priority Data

Sep. 9, 2020   (JP) .................................. 2020-151319

(51) Int. Cl.
  *H10D 64/23*   (2025.01)
  *H10D 30/01*   (2025.01)
  (Continued)

(52) U.S. Cl.
  CPC ....... *H10D 64/258* (2025.01); *H10D 30/0295* (2025.01); *H10D 30/0297* (2025.01);
  (Continued)

(58) Field of Classification Search
  CPC .. H10D 62/127; H10D 64/117; H10D 64/252; H10D 64/2523; H10D 64/2527;
  (Continued)

(56) References Cited

U.S. PATENT DOCUMENTS 6,153,896 A   11/2000   Omura et al.
7,843,004 B2   11/2010   Darwish
(Continued)

FOREIGN PATENT DOCUMENTS

JP   2003-188382 A   7/2003
JP   2009-004411 A   1/2009
(Continued)

OTHER PUBLICATIONS

Neudeck, The PN Junction Diode (The Modular Series on Solid State Devices; vol. 2; edition 2), 1989, Addison-Wesley Publishing Company, Inc., p. 5.*

*Primary Examiner* — Marcos D. Pizarro
(74) *Attorney, Agent, or Firm* — Kim & Stewart LLP

(57) ABSTRACT

A semiconductor device includes first to third electrodes, a semiconductor part, a control electrode and an insulating body. The second electrode is opposite to the first electrode. The semiconductor part is provided between the first electrode and the second electrode. The semiconductor part includes first and second trenches next to each other in a front side facing the second electrode. The second trench has a first width in a first direction directed from the first trench toward the second trench. The third electrode and the control electrode are provided inside the first trench. Another third electrode and the insulating body is provided inside the second trench. The insulating body is positioned in the second trench between said another third electrode and the second electrode. The insulating body has a second width in the first direction. The second width is equal to the first width of the second trench.

9 Claims, 13 Drawing Sheets

(51) Int. Cl.
*H10D 30/66* (2025.01)
*H10D 62/10* (2025.01)
*H10D 64/00* (2025.01)
*H10D 64/27* (2025.01)
*H10D 64/68* (2025.01)

(52) U.S. Cl.
CPC ......... *H10D 30/668* (2025.01); *H10D 62/127* (2025.01); *H10D 64/117* (2025.01); *H10D 64/252* (2025.01); *H10D 64/2523* (2025.01); *H10D 64/2527* (2025.01); *H10D 64/256* (2025.01); *H10D 64/513* (2025.01); *H10D 64/516* (2025.01); *H10D 64/518* (2025.01); *H10D 64/519* (2025.01); *H10D 64/693* (2025.01); *H01L 2924/13091* (2013.01)

(58) Field of Classification Search
CPC .. H10D 64/256; H10D 64/258; H10D 64/513; H10D 64/516; H10D 64/518; H10D 64/519; H10D 30/0295; H10D 30/0297; H10D 30/668; H01L 29/407; H01L 29/66727; H01L 29/66734; H01L 29/7813; H01L 2924/13091
See application file for complete search history.

(56) References Cited

U.S. PATENT DOCUMENTS

| | | | |
|---|---|---|---|
| 8,816,419 B2 * | 8/2014 | Takaishi | H01L 29/7828 |
| | | | 257/305 |
| 8,659,074 B2 | 12/2014 | Darwish | |
| 9,029,979 B2 | 5/2015 | Yoshimoto et al. | |
| 2011/0254088 A1 * | 10/2011 | Darwish | H01L 29/407 |
| | | | 257/341 |
| 2014/0167145 A1 | 6/2014 | Ichinoseki | |
| 2020/0052066 A1 * | 2/2020 | Poelzl | H01L 29/407 |

FOREIGN PATENT DOCUMENTS

| | | |
|---|---|---|
| JP | 2010-505270 A | 2/2010 |
| JP | 2014-120656 A | 6/2014 |
| JP | 2015-092593 A | 5/2015 |
| JP | 5852863 B2 | 2/2016 |

* cited by examiner

TRENCH-GATE POWER MOSFET WITH BURIED FIELD PLATES

CROSS-REFERENCE TO RELATED APPLICATIONS

This application is based upon and claims the benefit of priority from Japanese Patent Application No. 2020-151319, filed on Sep. 9, 2020; the entire contents of which are incorporated herein by reference.

FIELD

Embodiments relate to a semiconductor device.

BACKGROUND

There is a semiconductor device controlling electric power by on/off switching. It is desirable for such a semiconductor device to have a low on-resistance and fast switching characteristics.

DETAILED DESCRIPTION

Figure 1:
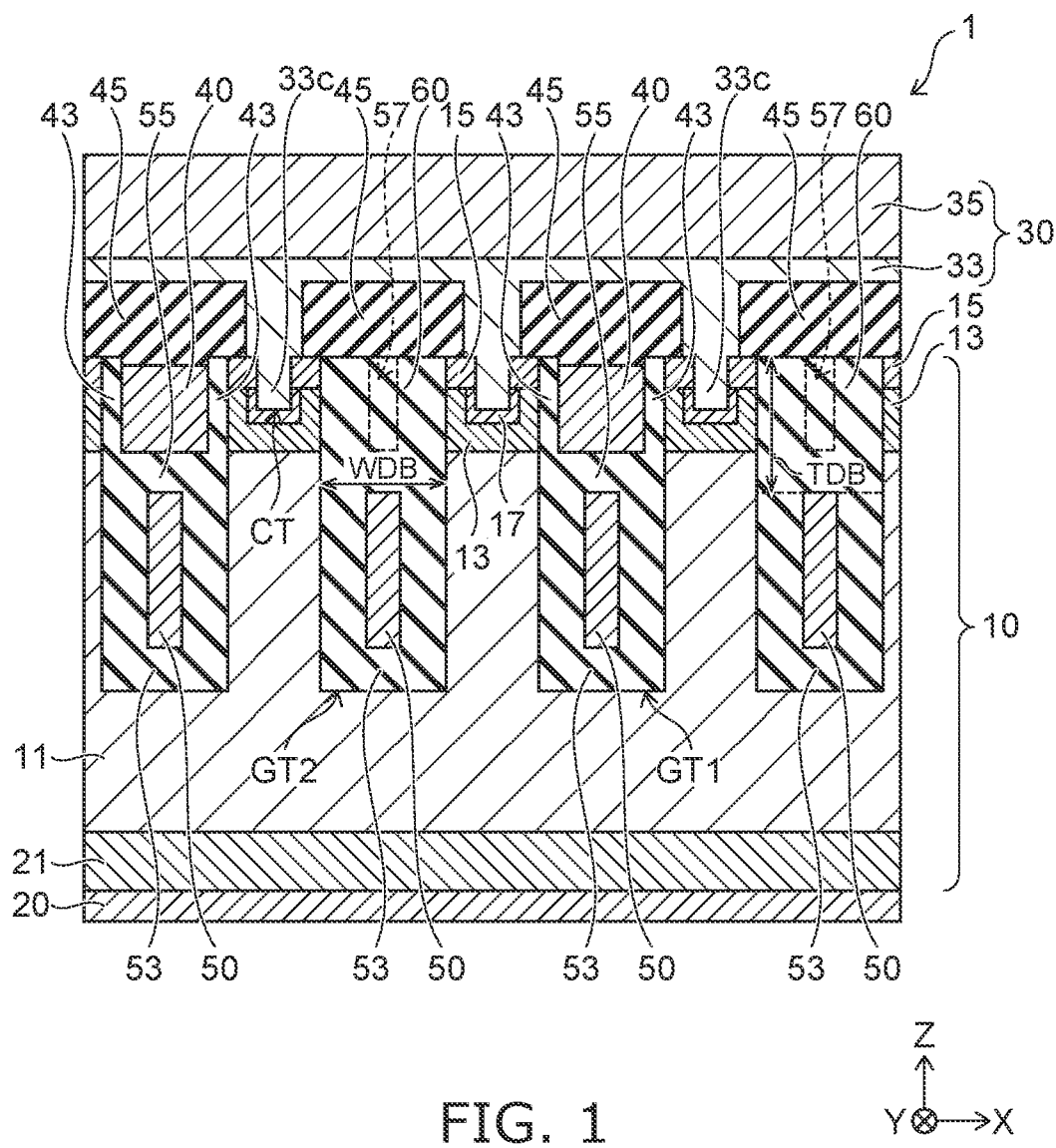
FIG. 1 is a schematic cross-sectional view showing a semiconductor device according to a first embodiment.

According to an embodiment, a semiconductor device includes first to third electrodes, a semiconductor part, a control electrode and an insulating body. The second electrode is opposite to the first electrode. The semiconductor part is provided between the first electrode and the second electrode. The semiconductor part includes first and second trenches next to each other in a front side of the semiconductor part, the front side facing the second electrode. The second trench has a first width in a first direction, the first direction being directed from the first trench toward the second trench. The third electrode is provided inside the first trench. The third electrode is electrically insulated from the semiconductor part by a first insulating film. The control electrode is provided inside the first trench with the third electrode. A distance from the control electrode to the first electrode is greater than a distance from the third electrode to the first electrode. The control electrode is electrically insulated from the semiconductor part by a second insulating film. The control electrode is electrically insulated from the third electrode by a third insulating film. The control electrode is electrically insulated from the second electrode by a fourth insulating film. Another third electrode is provided inside the second trench. Said another third electrode is electrically insulated from the semiconductor part by another first insulating film. The insulating body is provided in the second trench between said another third electrode and the second electrode. The insulating body has a second width in the first direction. The second width is equal to the first width of the second trench between said another third electrode and the second electrode. The semiconductor part includes a first layer of a first conductivity type, a second layer of a second conductivity type, and a third layer of the first conductivity type. The first layer extends between the first electrode and the second electrode. The first layer includes a portion positioned between the third electrode and said another third electrode. The second layer is provided between the first layer and the second electrode and between the control electrode and the insulating body. The third layer is provided between the second layer and the second electrode. The third layer contacts the second insulating film. The second layer and the third layer are electrically connected to the second electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view showing a semiconductor device 1 according to a first embodiment. The semiconductor device 1 is, for example, a MOSFET (Metal Oxide Semiconductor Field Effect Transistor) and includes a semiconductor part 10, a first electrode 20, a second electrode 30, a control electrode 40, and a third electrode 50. The semiconductor part 10 is, for example, silicon.

The first electrode 20 is, for example, a drain electrode and is provided at the backside of the semiconductor part 10. The first electrode 20 is, for example, a metal layer that includes aluminum (Al), gold (Au), etc.

The second electrode 30 is, for example, a source electrode and is provided at the front side of the semiconductor part 10. For example, the second electrode 30 has a structure in which a first metal layer 33 and a second metal layer 35 are stacked. The first metal layer 33 includes tungsten. The second metal layer 35 includes aluminum. The first metal layer 33 is provided between the semiconductor part 10 and the second metal layer 35 and is electrically connected to the semiconductor part 10.

The semiconductor part 10 includes a first trench GT1 and a second trench GT2 that are provided in the front side thereof. The second trench GT2 is next to the first trench GT1. For example, the first trench GT1 and the second trench GT2 are arranged in an X-direction along the front surface of the semiconductor part 10.

It should be noted that the arrangement of the first and second trenches GT1 and GT2 is not limited to the example. For example, the multiple first trenches GT1 and the multiple second trenches GT2 may be provided such that one of the multiple first trenches GT1 is provided at a position next to one of the multiple second trenches GT2.

The first trench GT1 includes the control electrode 40 and the third electrode 50. The control electrode 40 is provided between the second electrode 30 and the third electrode 50. The control electrode 40 and the third electrode 50 are, for example, conductive polysilicon.

The control electrode 40 is electrically insulated from the semiconductor part 10 by an insulating film 43. Moreover, the control electrode 40 is electrically insulated from the second electrode 30 by an insulating film 45. The third electrode 50 is electrically insulated from the semiconductor part 10 by an insulating film 53. The third electrode 50 is electrically insulated from the control electrode 40 by an insulating film 55. The insulating films 43, 45, 53, and 55 are, for example, silicon oxide films.

The third electrode 50 is positioned between the first electrode 20 and the control electrode 40. In other words, the distance from the third electrode 50 to the first electrode 20 is less than the distance from the control electrode 40 to the first electrode 20.

The second trench GT2 includes another third electrode 50. The control electrode 40 is not provided inside the second trench GT2. An insulating body 60 is provided in the second trench GT2. The insulating body 60 is provided between the second electrode 30 and the third electrode 50. The insulating body 60 is, for example, silicon oxide. For example, the insulating film 45 is also provided between the second electrode 30 and the insulating body 60.

Between the second electrode 30 and the third electrode 50, the insulating body 60 has a width WDB in the X-direction that is equal to the width in the X-direction of the second trench GT2. The insulating body 60 has a thickness TDB in the Z-direction. The Z-direction is directed from the first electrode 20 toward the second electrode 30. In the second trench, the insulating body 60 has, for example, the same thickness TDB as the distance from the third electrode 50 to the insulating film 45.

As shown by a broken line in FIG. 1, the insulating body 60 may include an insulating material (e.g., an insulating film 57) that is different from the other portions. The distance from the third electrode 50 to the insulating film 45 in the second trench GT2 may not be equal to the distance from the third electrode 50 to the insulating film 45 in the first trench GT1.

The semiconductor part 10 includes, for example, a first semiconductor layer 11, a second semiconductor layer 13, a third semiconductor layer 15, a fourth semiconductor layer 17, and a fifth semiconductor layer 21.

The first semiconductor layer 11 is, for example, an n-type drift layer that extends between the first electrode 20 and the second electrode 30. Although a first conductivity type is taken to be an n-type and a second conductivity type is taken to be a p-type in the following description, the embodiment is not limited thereto.

The first semiconductor layer 11 includes a portion that extends between the first trench GT1 and the second trench GT2. The third electrode 50 is positioned inside the first semiconductor layer 11 and faces the first semiconductor layer 11 via the insulating film 53.

The second semiconductor layer 13 is, for example, a p-type diffusion layer that is provided between the first trench GT1 and the second trench GT2. The second semiconductor layer 13 also is provided between the first semiconductor layer 11 and the second electrode 30. The second semiconductor layer 13 faces the control electrode 40 via the insulating film 43. Also, the second semiconductor layer 13 contacts the insulating body 60. For example, the thickness TDB in the Z-direction of the insulating body 60 is greater than the thickness in the Z-direction of the second semiconductor layer 13.

The third semiconductor layer 15 is, for example, an n-type source layer that is provided between the second semiconductor layer 13 and the second electrode 30. The third semiconductor layer 15 contacts the insulating film 43 and is electrically connected to the second electrode 30. For example, the third semiconductor layer 15 contacts the insulating body 60.

The fourth semiconductor layer 17 is, for example, a p-type contact layer. The fourth semiconductor layer 17 is provided between the second semiconductor layer 13 and the second electrode 30. The fourth semiconductor layer 17 is electrically connected to the second electrode 30. The fourth semiconductor layer 17, for example, is selectively provided inside the second semiconductor layer 13.

The semiconductor part 10 includes, for example, a contact trench CT that extends inside the third semiconductor layer 15. The contact trench CT has a depth enough to reach the fourth semiconductor layer 17. The first metal layer 33 of the second electrode 30 includes a contact portion 33c. The contact portion 33c extends inside the contact trench CT and contacts the third and fourth semiconductor layers 15 and 17. The third semiconductor layer 15 and the fourth semiconductor layer 17 are electrically connected to the second electrode 30 via the contact portion 33c.

The fifth semiconductor layer 21 is, for example, an n-type drain layer that is provided between the first semiconductor layer 11 and the first electrode 20. The fifth semiconductor layer 21 includes an n-type impurity with a higher concentration than the n-type impurity concentration of the first semiconductor layer 11. For example, the fifth semiconductor layer 21 is in contact with the first electrode 20 and electrically connected thereto.

Figure 2A:
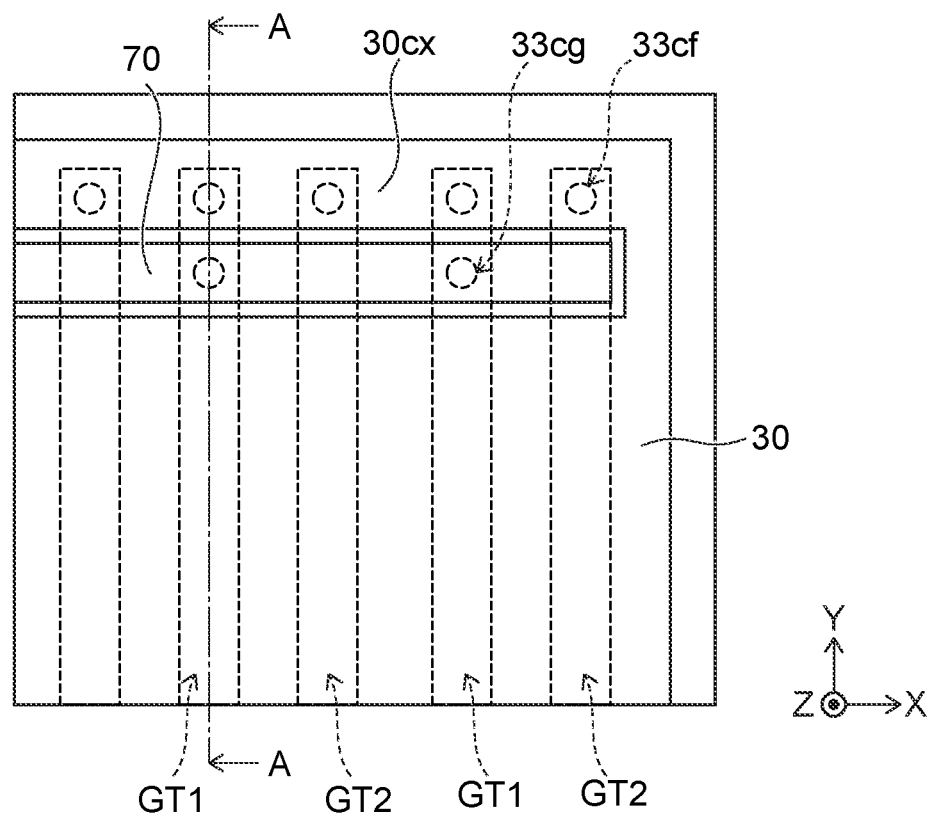
FIGS. 2A and 2B are schematic views showing the semiconductor device according to the first embodiment.
Figure 2B:
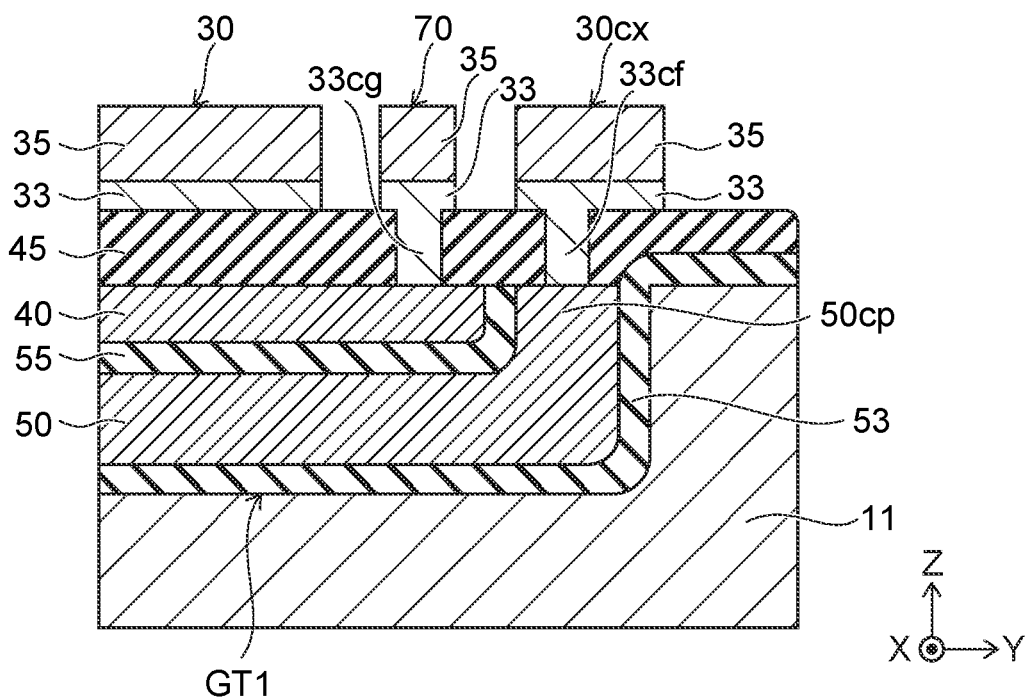

FIGS. 2A and 2B are other schematic views showing the semiconductor device 1 according to the first embodiment. FIG. 2A is a top view schematically showing a portion of the semiconductor device 1. FIG. 2B is a cross-sectional view along the line A-A shown in FIG. 2A.

As shown in FIG. 2A, the semiconductor device 1 includes the second electrode 30 and a control interconnect 70. The control interconnect 70 is apart from the second electrode 30 and electrically isolated from the second electrode 30. The second electrode 30 includes, for example, a major portion and a connection portion 30cx that extends along the control interconnect 70. The control interconnect 70 extends between the connection portion 30cx and the major portion of the second electrode 30.

The first trench GT1 and the second trench GT2 each extend in the Y-direction below the second electrode 30 and the control interconnect 70. The control interconnect 70 and the connection portion 30cx of the second electrode 30 extend in the X-direction and cross the first trench GT1 and the second trench GT2.

As shown in FIG. 2B, the control electrode 40 and the third electrode 50 extend in the Y-direction through the first trench GT1. The third electrode 50 includes a connection portion 50cp at the end of the first trench GT1. For example, the connection portion 50cp extends in the Z-direction and includes an exposed surface at the same level as the upper surface of the control electrode 40. The third electrode 50 in the second trench GT2 also includes a similar connection portion 50cp.

The second electrode 30 includes a contact portion 33cf that is connected to the third electrode 50. The contact portion 33cf is provided at the position where the connection portion 30cx crosses the first trench GT1. Another contact portion 33cf is provided at the position where the connection portion 30cx crosses the second trench GT2. The contact portion 33cf is a portion of the first metal layer 33 and extends, for example, inside a contact hole provided in the insulating film 45. The contact portion 33cf contacts the connection portion 50cp of the third electrode 50.

The control interconnect 70 also has a stacked structure that includes another first and second metal layers 33 and 35. For example, the first metal layer 33 is provided on the insulating film 45; and the second metal layer 35 is provided on the first metal layer 33.

The first metal layer 33 of the control interconnect 70 includes a contact portion 33cg. The contact portion 33cg is provided at the position where the control interconnect 70 crosses the first trench GT1 and is connected to the control electrode 40. For example, the contact portion 33cg extends inside a contact hole provided in the insulating film 45 and contacts the control electrode 40.

In the semiconductor device 1, the control electrode 40 is not provided in the second trench GT2, and the insulating body 60 is provided therein. A parasitic capacitance Cgs between the gate and source can be reduced thereby, and the switching speed can be faster. Also, by providing the insulating body 60, the stress that is applied to the second semiconductor layer 13 is increased between the first trench GT1 and the second trench GT2. Thus, the lattice strain of the second semiconductor layer 13 is increased, and the electron mobility is increased inside the second semiconductor layer 13. The on-resistance of the semiconductor device 1 can be reduced thereby.

A method for manufacturing the semiconductor device 1 will now be described with reference to FIGS. 3A to 8B. FIGS. 3A to 8B are schematic cross-sectional views showing manufacturing processes of the semiconductor device 1 according to the first embodiment.

Figure 3A:
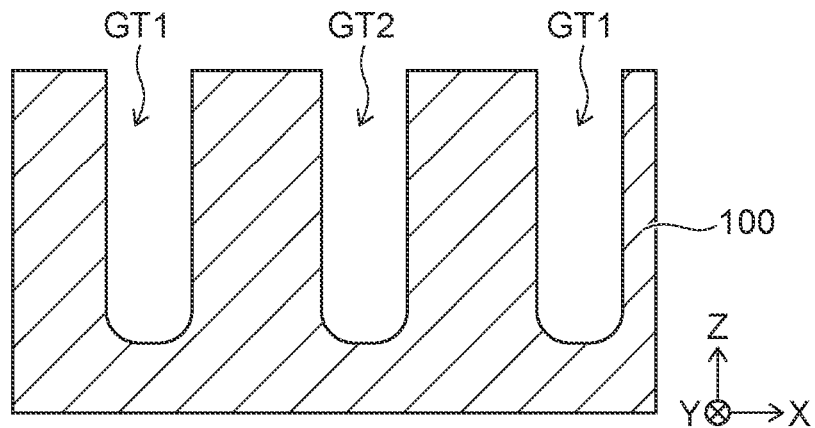
FIGS. 3A to 8B are schematic cross-sectional views showing manufacturing processes of the semiconductor device according to the first embodiment.

As shown in FIG. 3A, the first trench GT1 and the second trench GT2 are formed in the front side of a semiconductor wafer 100. The semiconductor wafer 100 is, for example, a silicon wafer of the first conductivity type. The semiconductor wafer 100 includes a first-conductivity-type impurity with the same concentration as the first-conductivity-type impurity of the first semiconductor layer 11.

The first trench GT1 and the second trench GT2 are formed by selectively etching the semiconductor wafer 100 by using an etching mask (not-illustrated). For example, the first trench GT1 and the second trench GT2 are formed using anisotropic RIE (Reactive Ion Etching).

Figure 3B:
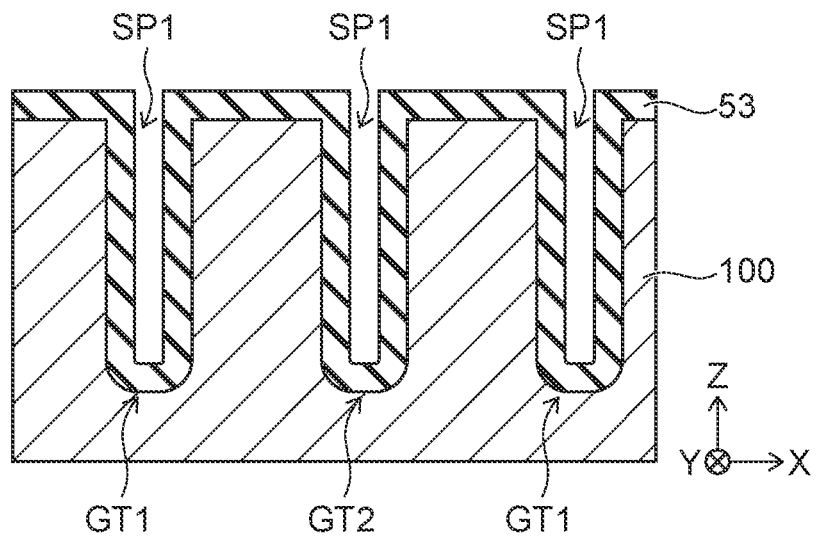

As shown in FIG. 3B, the insulating film 53 is formed on the front surface of the semiconductor wafer 100. The insulating film 53 covers the inner surfaces of the first and second trenches GT1 and GT2 so that spaces SP1 remain therein. The insulating film 53 is formed by, for example, thermal oxidation of the semiconductor wafer 100. The insulating film 53 is, for example, a silicon oxide film.

Figure 3C:
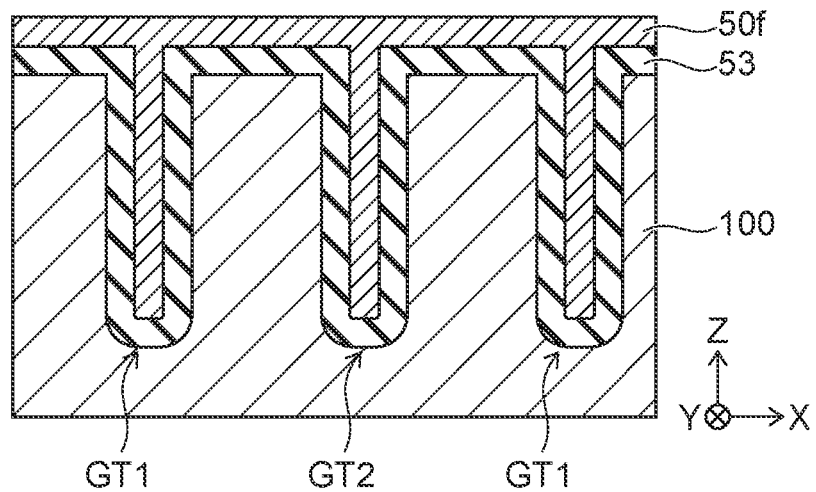

As shown in FIG. 3C, a conductive layer 50f is formed to fill the spaces SP1 inside the first trench GT1 and the second trench GT2. The conductive layer 50f is, for example, a conductive polysilicon layer formed using CVD (Chemical Vapor Deposition).

Figure 4A:
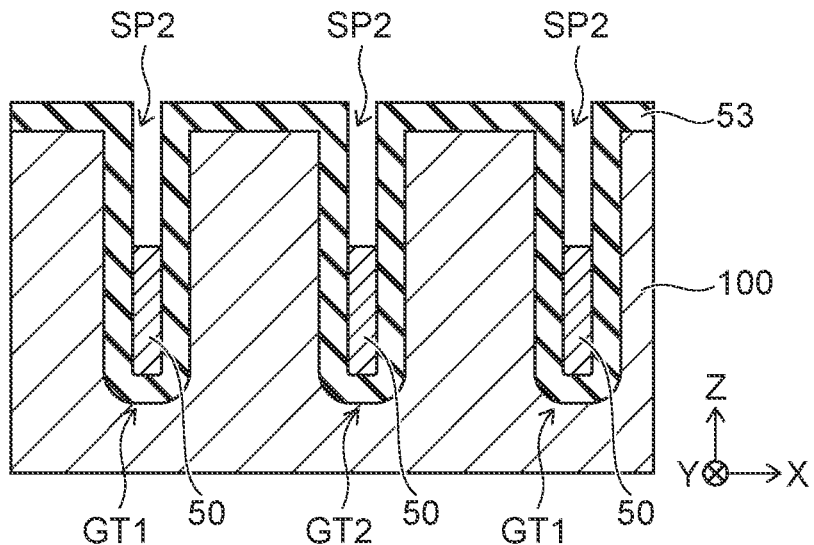

As shown in FIG. 4A, the third electrodes 50 are formed respectively in the lower portions of the first and second trenches GT1 and GT2 by etching the conductive layer 50f. Spaces SP2 are formed in the upper portions of the first and second trenches GT1 and GT2, respectively.

Figure 4B:
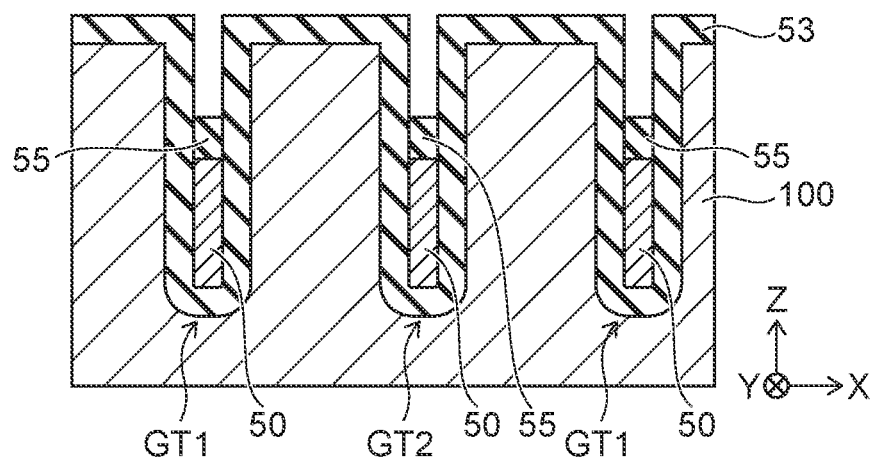

As shown in FIG. 4B, the insulating films 55 are formed on the third electrodes 50 in the spaces SP2. The insulating films 55 are formed by, for example, thermal oxidation of the third electrodes 50. The insulating film 55 are, for example, silicon oxide films.

Figure 4C:
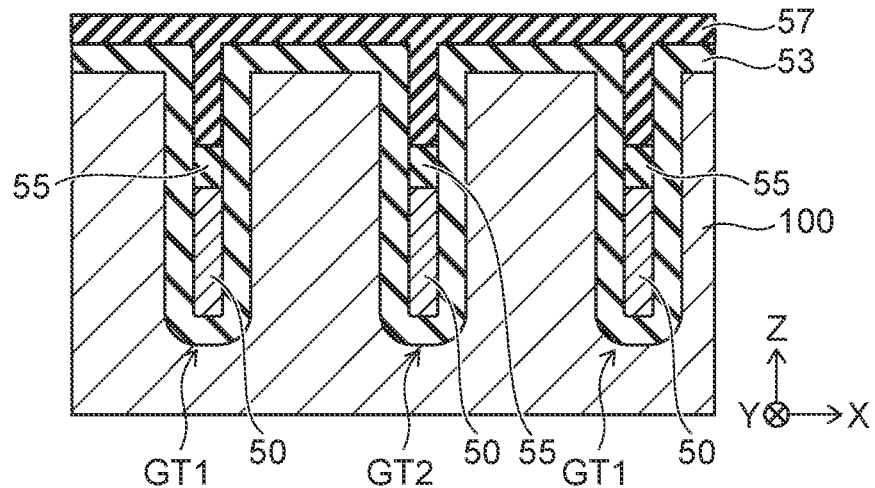

As shown in FIG. 4C, the insulating film 57 is formed to fill the spaces SP2. The insulating film 57 is, for example, a silicon oxide film that is formed using CVD.

Figure 5A:
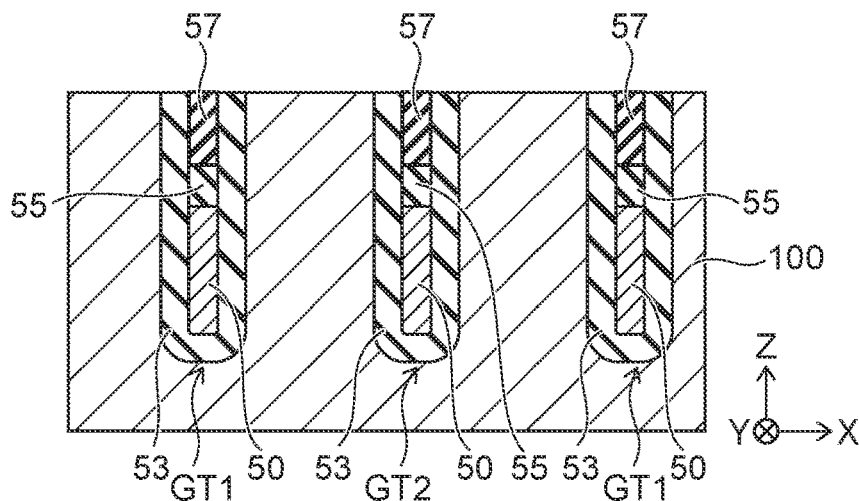

As shown in FIG. 5A, the insulating film 53 and the insulating film 57 are removed so that the portions that are formed inside the first trench GT1 and the second trench GT2 remain, and the front surface of the semiconductor wafer 100 is exposed. For example, the insulating film 53 and the insulating film 57 are removed by wet etching or CMP (Chemical Mechanical Polishing).

Figure 5B:
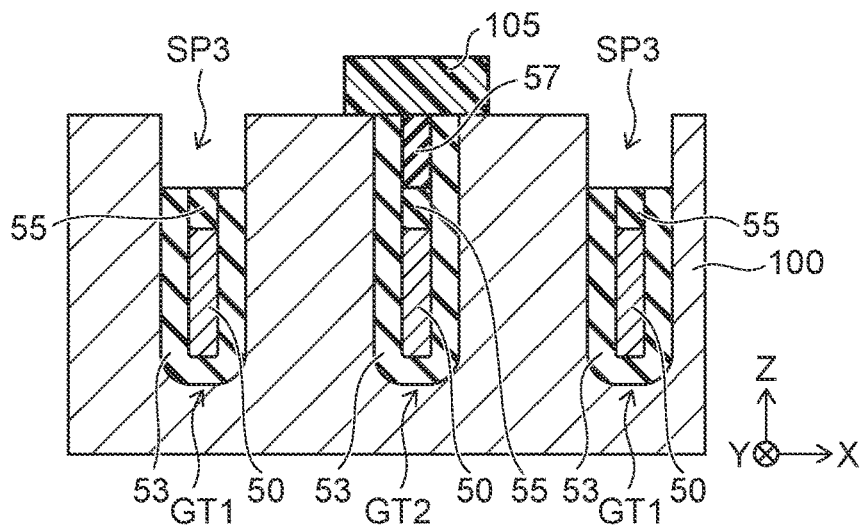

As shown in FIG. 5B, a space SP3 is formed in the upper portion of the first trench GT1 by removing the insulating film 57 and a portion of the insulating film 53. The insulating film 53 and the insulating film 57 are maintained inside the second trench GT2 between the first trenches GT1 because the second trench GT2 is covered with an etching mask 105. The insulating film 57 and the portion of the insulating film 53 are removed by, for example, wet etching.

Figure 5C:
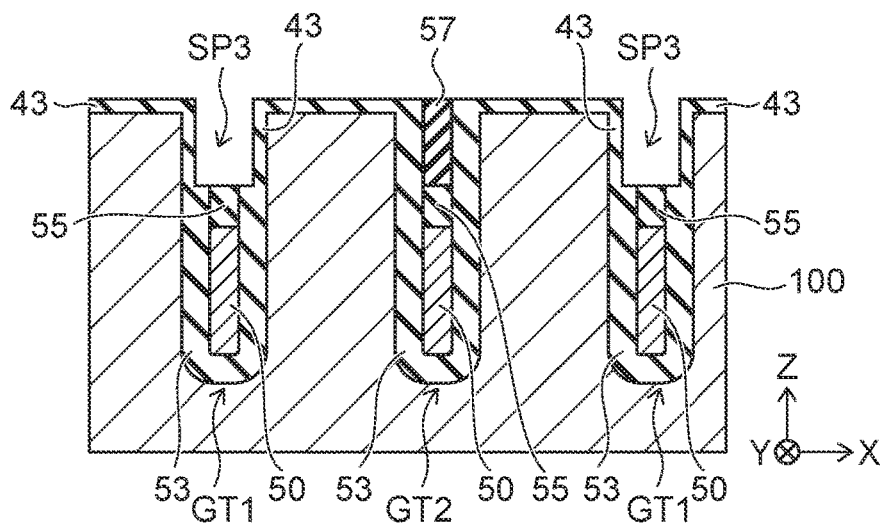

As shown in FIG. 5C, after the etching mask 105 is removed, the insulating film 43 is formed on the wall surface of the first trench GT1 in the space SP3. The insulating film 43 is also formed on the front surface of the semiconductor wafer 100. For example, the insulating film 43 is formed by thermal oxidation of the semiconductor wafer 100. The insulating film 43 is, for example, a silicon oxide film.

Figure 6A:
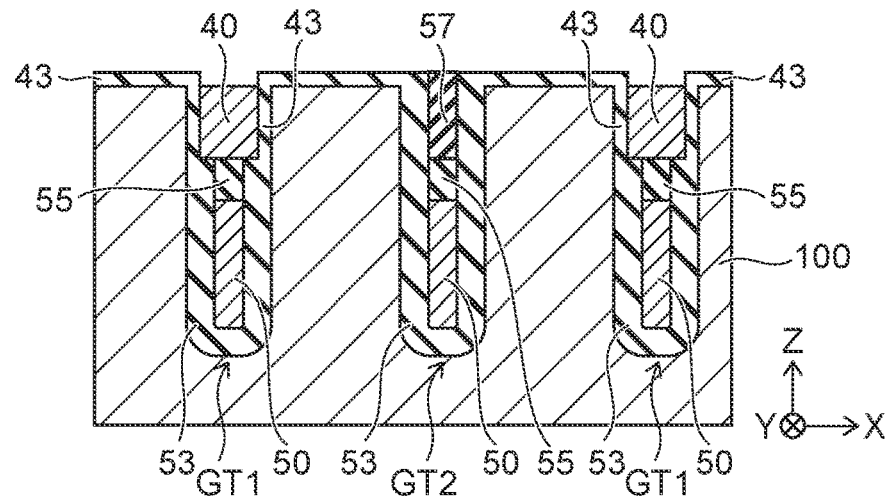

As shown in FIG. 6A, the control electrode 40 is formed inside the space SP3. The control electrode 40 is, for example, conductive polysilicon. For example, a polysilicon layer is formed on the front side of the semiconductor wafer 100 by using CVD, and the control electrode 40 is formed by subsequently removing the polysilicon layer so that a portion thereof remains in the space SP3. For example, the polysilicon layer is removed by isotropic dry etching.

Figure 6B:
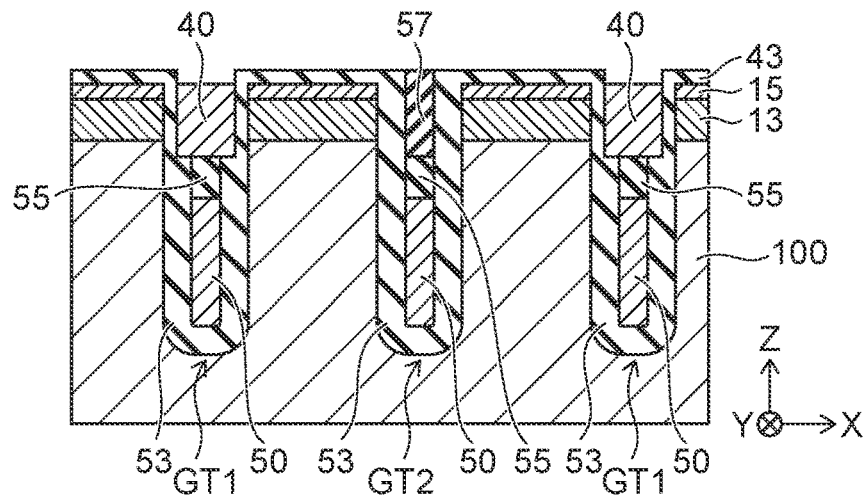

As shown in FIG. 6B, the second semiconductor layer 13 and the third semiconductor layer 15 are formed in the front side of the semiconductor wafer 100.

The second semiconductor layer 13 is formed by ion implanting a second-conductivity-type impurity such as boron into the front side of the semiconductor wafer and by subsequently performing heat treatment to activate and diffuse the ion-implanted impurity. The second semiconductor layer 13 is formed, for example, such that the lower surface of the second semiconductor layer 13 is provided at a higher position in the Z-direction than the position of the lower end of the control electrode 40.

After the second semiconductor layer 13 is formed, the third semiconductor layer 15 is formed by ion implanting the first-conductivity-type impurity such as phosphorus and by performing heat treatment to activate the ion-implanted impurity. The third semiconductor layer 15 is formed so that the lower surface of the third semiconductor layer 15 is provided at a higher position in the Z-direction than the position of the lower surface of the second semiconductor layer 13.

Figure 6C:
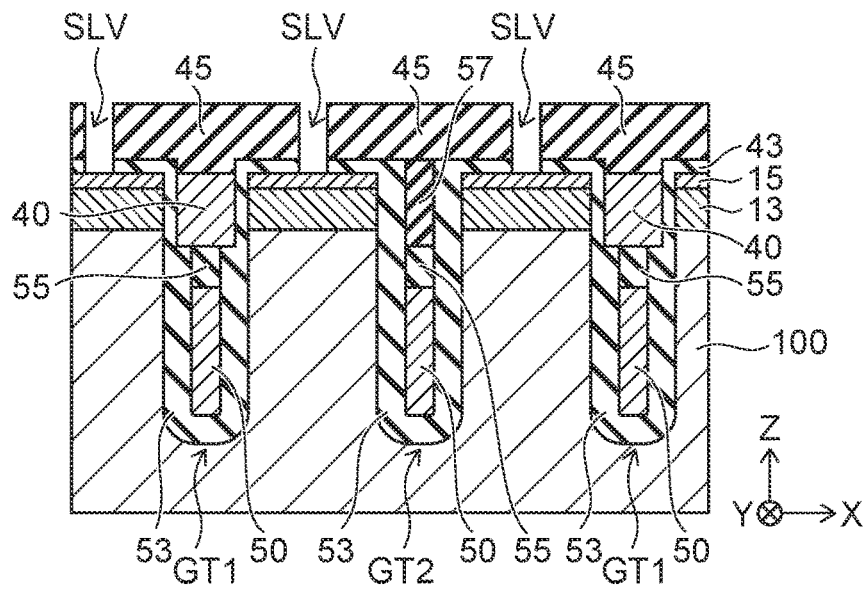

As shown in FIG. 6C, after forming the insulating film 45 on the control electrode 40 and the insulating film 43, a trench SLV is formed from the upper surface of the insulating film 45 to the third semiconductor layer 15. The trench SLV is formed to communicate with the third semiconductor layer 15. The insulating film 45 is, for example, a silicon oxide film formed by CVD. The trench SLV extends, for example, in the Y-direction. The trench SLV is formed by selectively removing portions of the insulating film 45 and the insulating film 43 using a not-illustrated etching mask. The portions of the insulating film 45 and the insulating film 43 are removed using, for example, wet etching.

Figure 7A:
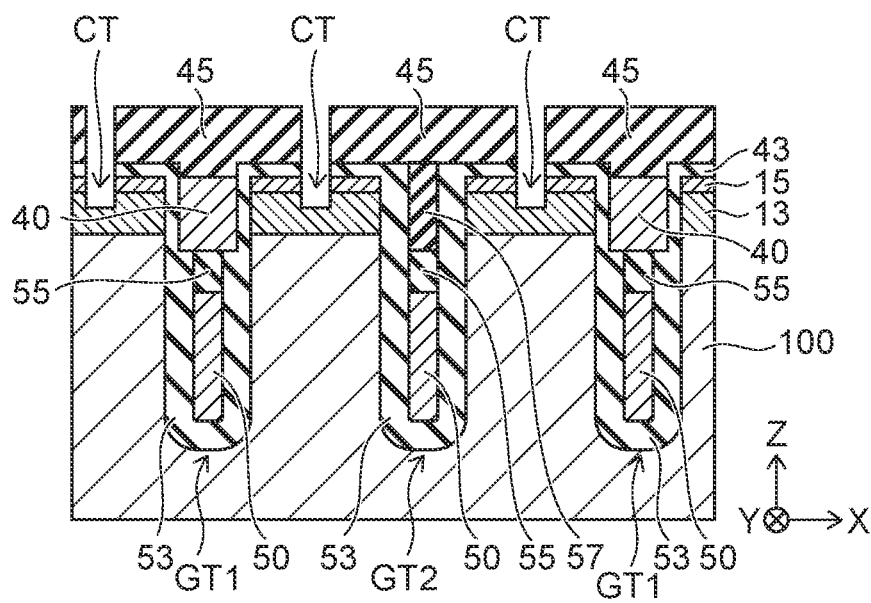

As shown in FIG. 7A, the contact trench CT is formed by selectively removing portions of the third semiconductor layer 15 and the second semiconductor layer 13 via the trench SLV. For example, the contact trench CT is formed by anisotropic RIE. The contact trench CT has a depth enough to reach the second semiconductor layer 13 from the upper surface of the third semiconductor layer 15.

Figure 7B:
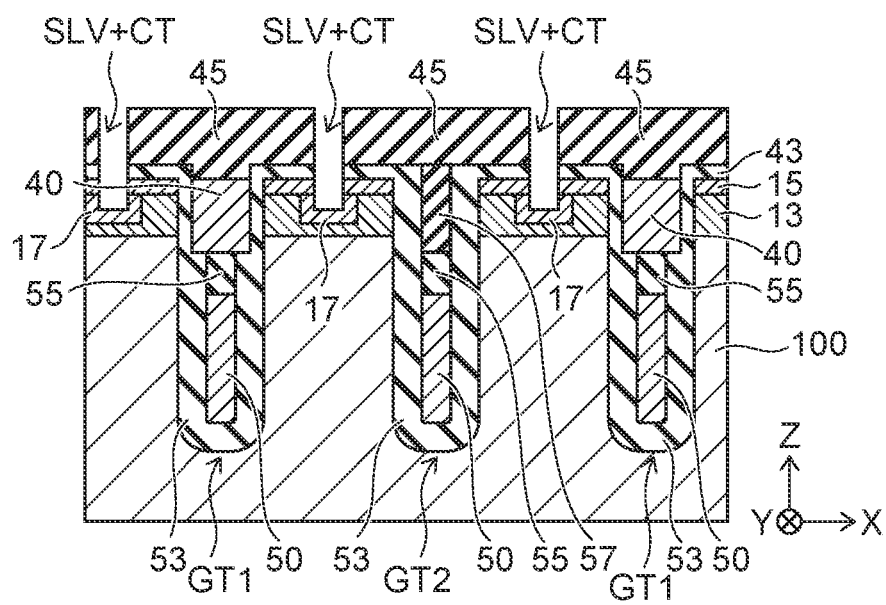

As shown in FIG. 7B, the fourth semiconductor layer 17 is formed inside the second semiconductor layer 13. The fourth semiconductor layer 17 is formed by, for example, ion implanting the second-conductivity-type impurity such as boron via the trench SLV and the contact trench CT and by performing heat treatment to activate the implanted impurity.

Figure 8A:
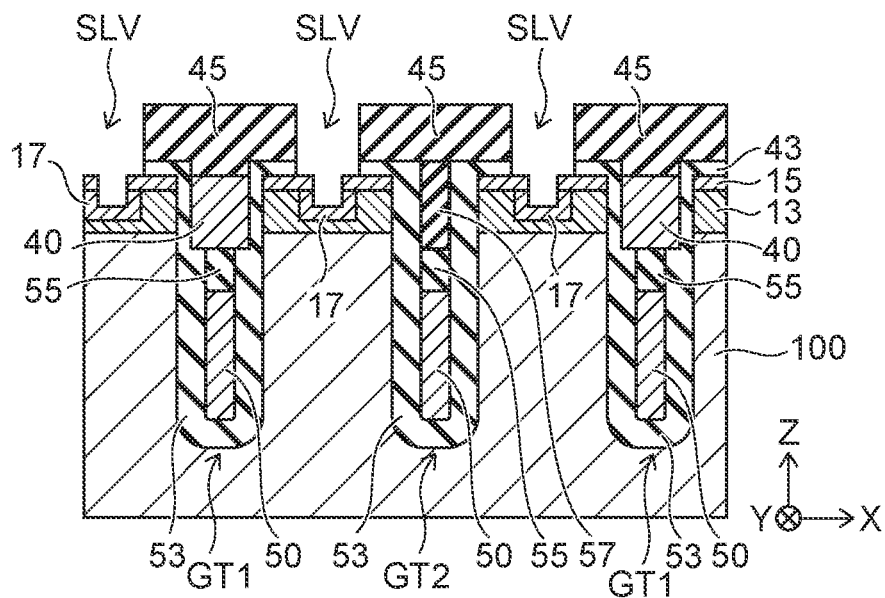

As shown in FIG. 8A, the upper surface of the third semiconductor layer 15 is partially exposed by widening the width in the X-direction of the trench SLV. The trench SLV is widened by partially removing the insulating film 43 and the insulating film 45.

Figure 8B:
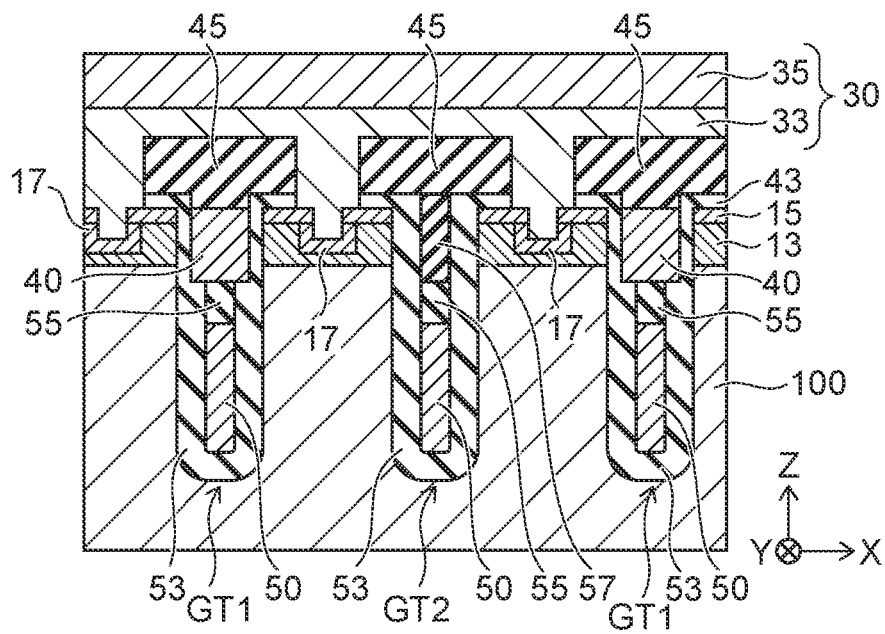

As shown in FIG. 8B, the second electrode 30 is formed at the front side of the semiconductor wafer 100. The first metal layer 33 of the second electrode 30 covers the insulating film 45. The trench SLV and the contact trench CT are filled with a portion of the first metal layer 33.

The first metal layer 33 is, for example, a tungsten layer formed by CVD. The first metal layer 33 may have, for example, a stacked structure of titanium nitride (TiN) and tungsten. In such a case, the TiN layer is provided between the semiconductor wafer 100 and the tungsten layer.

For example, the second metal layer 35 of the second electrode 30 is provided on the first metal layer 33 by sputtering. The second metal layer 35 is, for example, a metal layer that includes aluminum.

Then, the semiconductor wafer 100 is thinned by polishing or etching the backside of the semiconductor wafer 100. Also, the fifth semiconductor layer 21 is formed at the backside of the semiconductor wafer 100 (referring to FIG. 1). The fifth semiconductor layer 21 is formed by ion implanting the first-conductivity-type impurity such as phosphorus and by performing laser annealing or the like to activate the implanted impurity. The first semiconductor layer 11 is a portion of the semiconductor wafer 100 that is positioned between the fifth semiconductor layer 21 and the second semiconductor layer 13. Subsequently, the first electrode 20 is formed on the back surface of the semiconductor wafer 100; and the semiconductor device 1 is completed.

In the example, the portion of the semiconductor device 1 that corresponds to the insulating body 60 includes the insulating film 57, the insulating film 55, and a portion of the insulating film 53. The insulating films 53, 55, and 57 each are silicon oxide films and have thermal expansion coefficients that are, for example, less than the thermal expansion coefficient of silicon.

In the semiconductor device 1, the insulating body 60 is provided inside the second trench GT2 instead of the control electrode 40. The stress that is applied to the second semiconductor layer 13 by the insulating body 60 can be increased thereby. Thus, the lattice strain of the second semiconductor layer 13 is increased; and the electron mobility inside the second semiconductor layer 13 is increased, for example. The electric resistance can be reduced in the inversion channel induced at the interface between the second semiconductor layer 13 and the insulating film 43, and thereby, the on-resistance of the semiconductor device 1 can be reduced.

Figure 9:
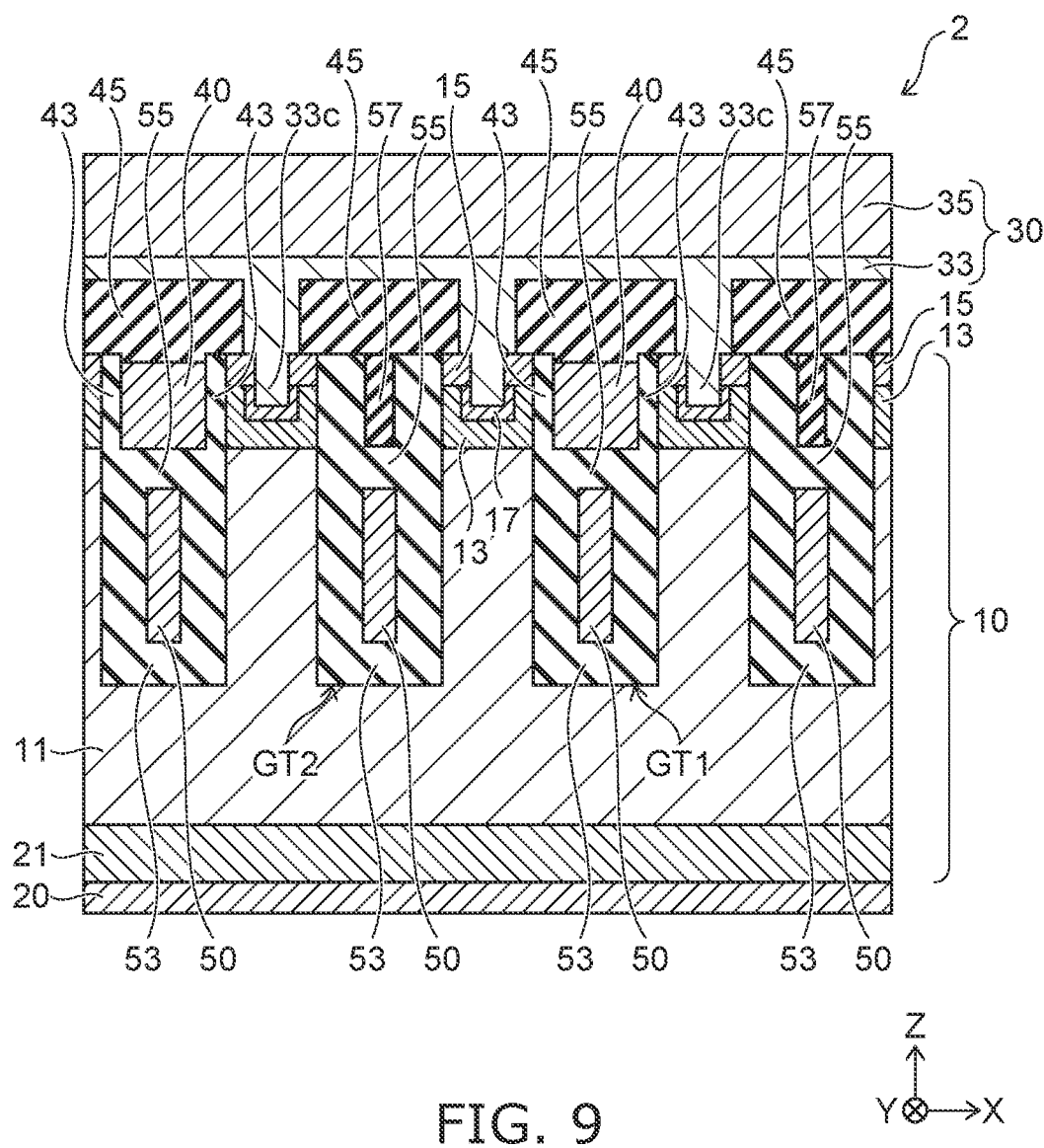
FIG. 9 is a schematic cross-sectional view showing a semiconductor device according to a modification of the first embodiment.

FIG. 9 is a schematic cross-sectional view showing a semiconductor device 2 according to a modification of the first embodiment. In the example, the insulating film 57 includes a material different from materials of the insulating film 53 and the insulating film 55. The insulating film 57 includes, for example, a silicate glass that includes boron and phosphorus (BPSG). The BPSG film is formed using CVD.

The silicon oxide film used as the insulating film 57 may be formed by CVD using high density plasma. When the insulating film 53 is the silicon oxide film formed by, for example, thermal oxidation of silicon, the film density of the insulating film 57 that is formed by CVD is less than the film density of the insulating film 53. Here, the "film density" is the atomic density in the insulating film. The film density may be, for example, the density of silicon atoms in the insulating film. The film density can be detected using, for example, X-ray Reflectivity (XRP). Also, the film density difference can be detected using the difference of contrast in a High Angle Annular Dark-Field Scanning Transmission Electron Microscopy (HAADF-STEM) image.

In other words, the insulating body 60 may be configured to include different materials such as silicon oxide and BPSG. The insulating film 57 may be a silicon nitride film. For example, when the stress that is applied to the second semiconductor layer 13 is too large when the entire insulating body 60 is formed of silicon oxide, the magnitude of the stress applied to the second semiconductor layer 13 can be adjusted by adding a material different from silicon oxide as the insulating film 57. The manufacturing yield of the semiconductor device 2 can be increased thereby.

Second Embodiment

Figure 10:
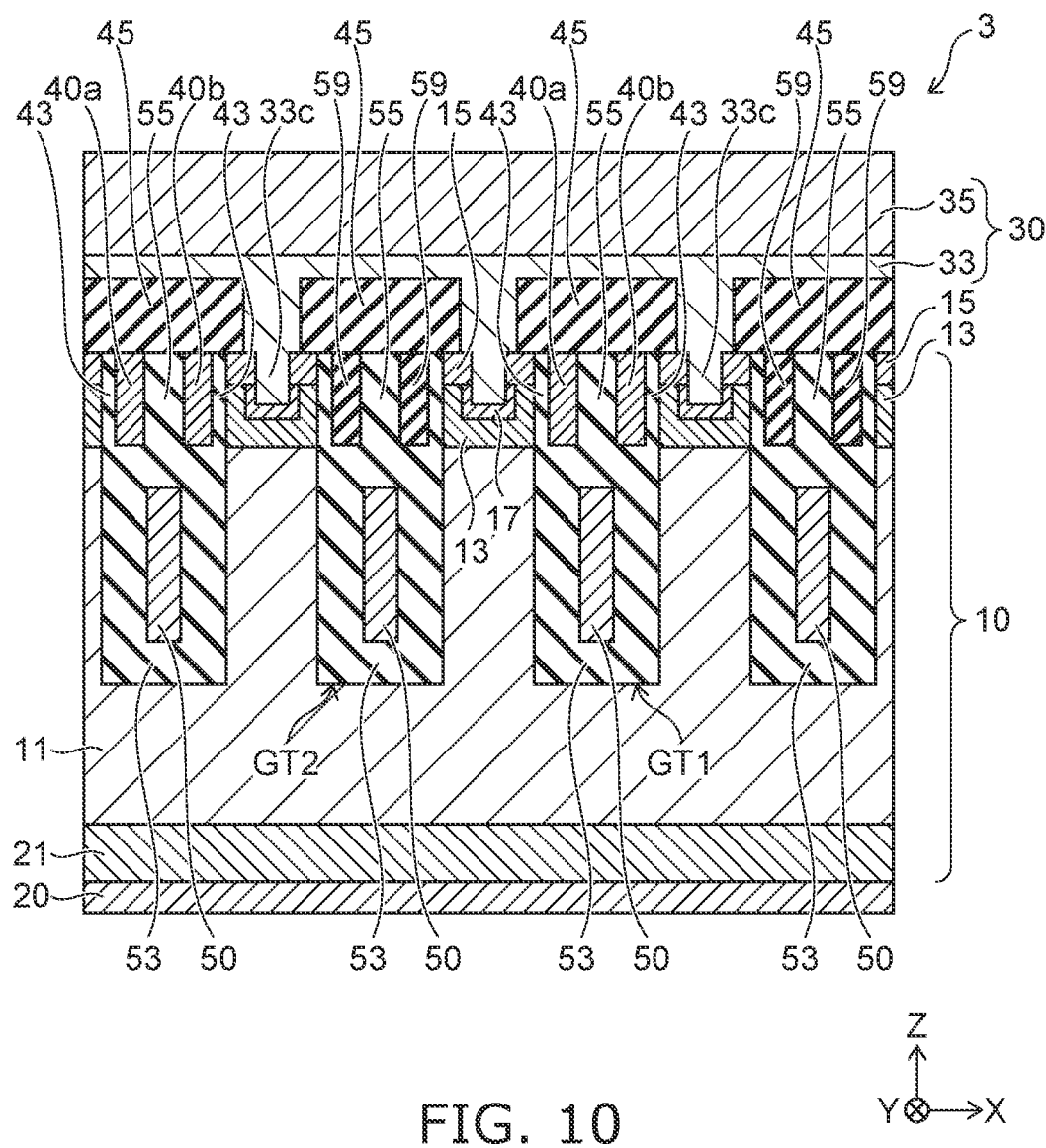
FIG. 10 is a schematic cross-sectional view showing a semiconductor device according to a second embodiment.

FIG. 10 is a schematic cross-sectional view showing a semiconductor device 3 according to a second embodiment. In the example, the control electrode 40 includes a first control portion 40a and a second control portion 40b.

For example, the first control portion 40a and the second control portion 40b are arranged in the X-direction and face the second semiconductor layer 13 via the insulating film 43. The insulating film 55 extends between the first control portion 40a and the second control portion 40b.

The third electrode 50 is provided inside the first trench GT1 so that the distance from the third electrode 50 to the first electrode 20 is less than the distances to the first electrode 20 from the first and second control portions 40a and 40b. The third electrode 50 is electrically insulated from the first and second control portions 40a and 40b by the insulating film 55.

The insulating film 43, the insulating film 55, and two insulating films 59 are provided in the second trench GT2 (referring to FIG. 10). The portion that corresponds to the insulating body 60 includes the insulating film 43, the insulating film 55 and two insulating films 59. The insulating film 55 extends between the two insulating films 59. Each of the insulating films 59 is positioned between the insulating film 43 and the insulating film 55. The insulating film 59 may include the same material as or a material different from the materials of the insulating film 43 and the insulating film 55.

Figure 11A:
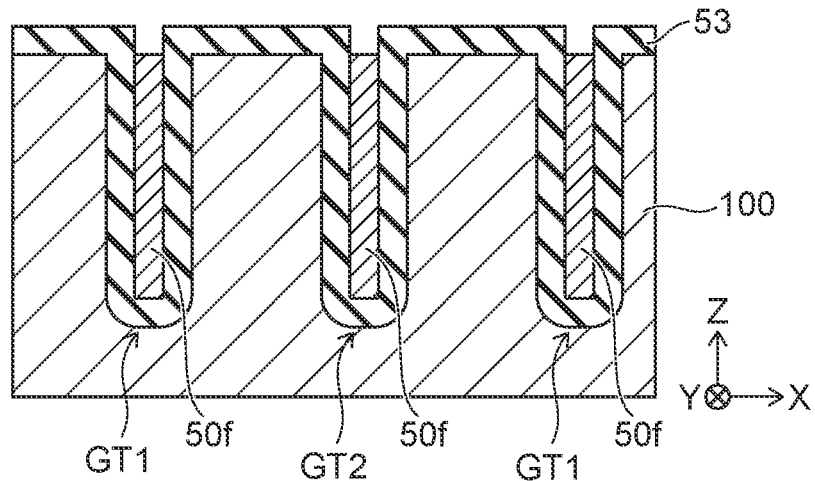
FIGS. 11A to 12C are schematic cross-sectional views showing manufacturing processes of the semiconductor device according to the second embodiment.

A method for manufacturing the semiconductor device 3 will now be described with reference to FIGS. 11A to 12C. FIGS. 11A to 12C are schematic cross-sectional views showing manufacturing processes of the semiconductor device 3 according to the second embodiment. FIG. 11A illustrates a manufacturing process continuing from FIG. 3C.

As shown in FIG. 11A, the conductive layer 50f is removed so that the portions formed in the first trench GT1 and in the second trench GT2 remain. The upper ends of the conductive layer 50f in the first trench GT1 and in the second trench GT2 are positioned at substantially the same level in the Z-direction as the front surface of the semiconductor wafer 100. The conductive layer 50f is removed by, for example, isotropic dry etching.

Figure 11B:
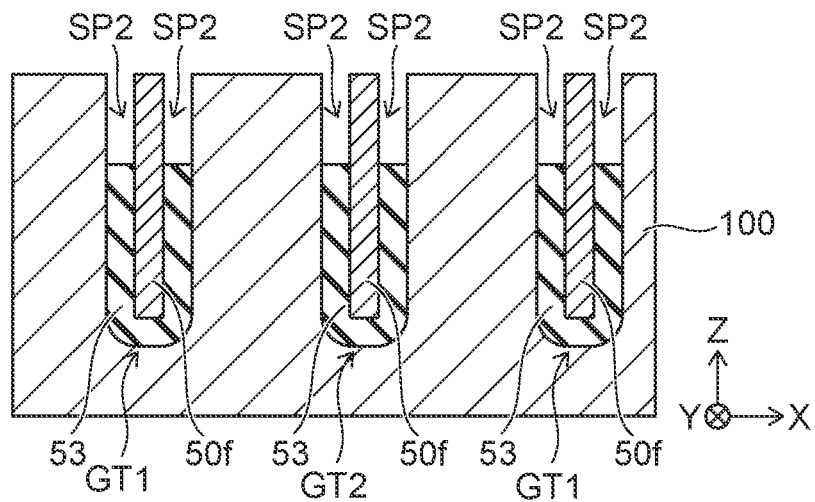

As shown in FIG. 11B, the insulating film 53 is partially etched so that the front surface of the semiconductor wafer 100 is exposed and the space SP2 is formed in the upper portions of the first and second trenches GT1 and GT2. The insulating film 53 is removed by, for example, wet etching.

Figure 11C:
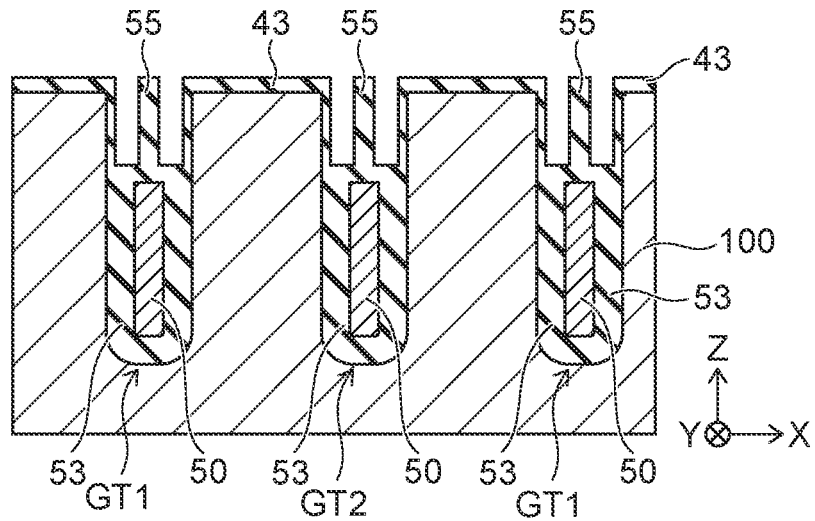

As shown in FIG. 11C, the insulating film 43 is formed on the wall surface of the first trench GT1 and the wall surface of the second trench in the space SP2. The insulating film 43 is also formed on the front surface of the semiconductor wafer 100. The insulating film 43 is formed by, for example, thermal oxidation of the semiconductor wafer 100. The insulating film 43 is, for example, a silicon oxide film.

The conductive layer 50f that is exposed in the space SP2 also is oxidized through the thermal oxidation of the semiconductor wafer 100 in the process of forming the insulating film 43. Thereby, the third electrode 50 is formed in the lower portion of the first trench GT1 and the lower portion of the second trench GT2. The insulating film 55 is formed on the third electrode 50. The insulating film 55 is, for example, a silicon oxide film.

Figure 12A:
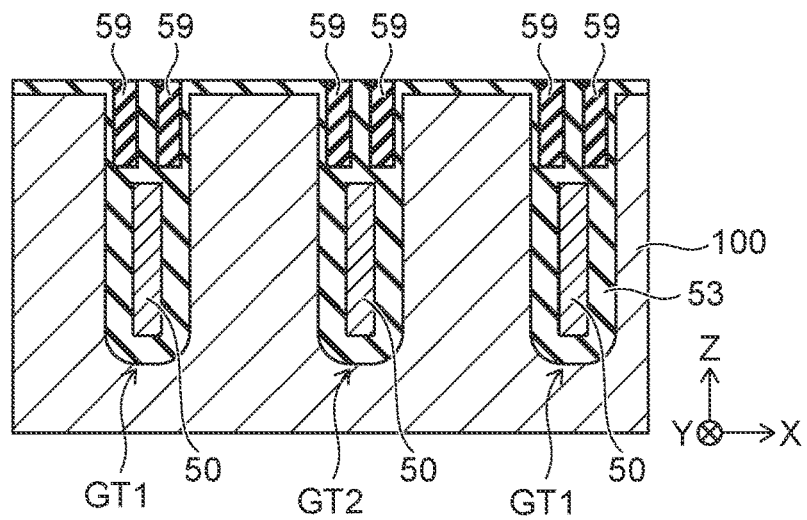

As shown in FIG. 12A, the space SP2 is filled with the insulating film 59. The insulating film 59 is formed on the entire front side of the semiconductor wafer 100, and then, is removed so that the portion in the space SP2 remains. The insulating film 59 is removed by, for example, wet etching or CMP. The insulating film 59 is, for example, a silicon nitride film.

Figure 12B:
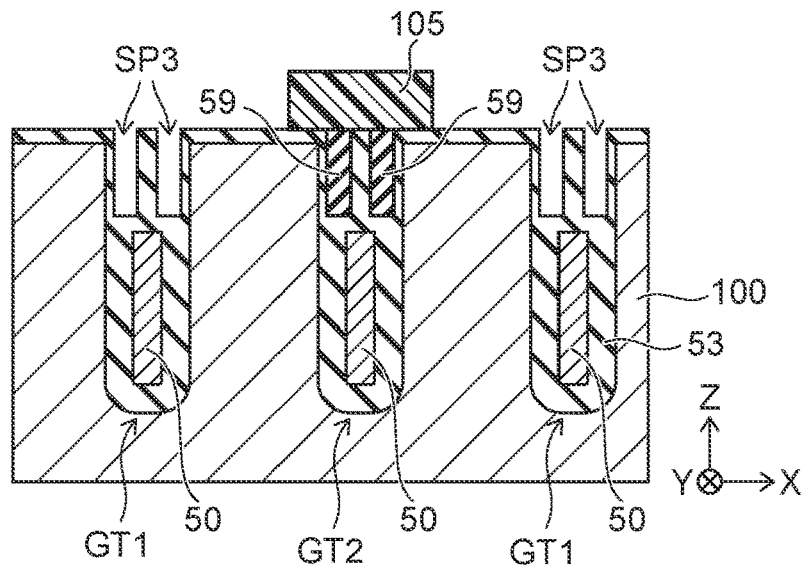

As shown in FIG. 12B, the space SP3 is formed in the upper portion of the first trench GT1 by selectively removing the insulating film 59. The insulating film 59 is removed by, for example, wet etching. In this process, the second trench GT2 is covered with the etching mask 105, and the insulating film 59 is maintained in the second trench GT2.

Figure 12C:
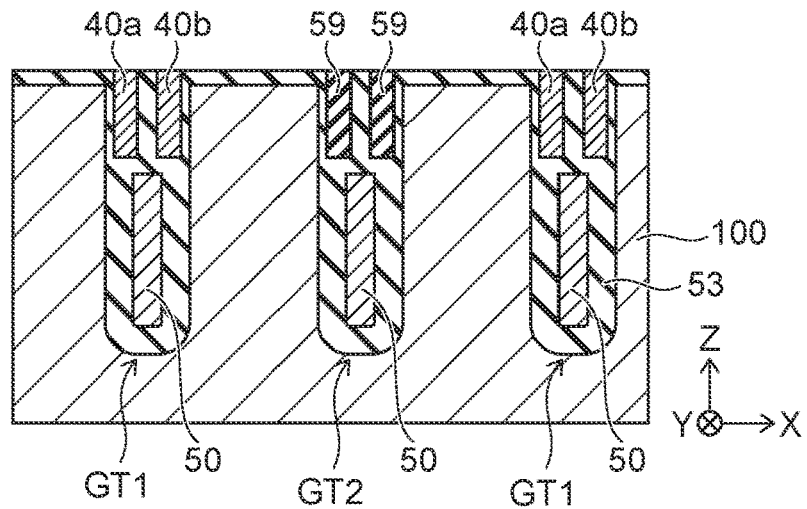

As shown in FIG. 12C, after the etching mask 105 is removed, the first and second control portions 40a and 40b of the control electrode 40 are formed inside the space SP3 by filling with, for example, conductive polysilicon.

Then, the semiconductor device 3 is completed by the processes shown in FIG. 6A and subsequent drawings. The manufacturing method according to the embodiment is not limited to the example. For example, the first control portion 40a and the second control portion 40b may be formed by filling the spaces SP2 with conductive polysilicon instead of the insulating films 59 in the process shown in FIG. 12A. Then, instead of the process shown in FIG. 12B, the polysilicon is selectively removed in the second trench GT2. Subsequently, in the process shown in FIG. 12C, the spaces in the upper portion of the second trench GT2 are filled with the insulating film 59. According to this method, for example, a silicon oxide film and a BPSG film can be used as the insulating film 59.

In the semiconductor device 3, the first and second control portions 40a and 40b of the control electrode 40 also are not provided inside the second trench GT2; and the portion that corresponds to the insulating body 60 is provided; therefore, the parasitic capacitance Cgs between the gate and source can be reduced, and the stress that is applied to the second semiconductor layer 13 can be increased between the first trench GT1 and the second trench GT2. The magnitude of the stress also can be adjusted by partially replacing the portion corresponding to the insulating body 60 with a different material from silicon oxide.

Third Embodiment

Figure 13:
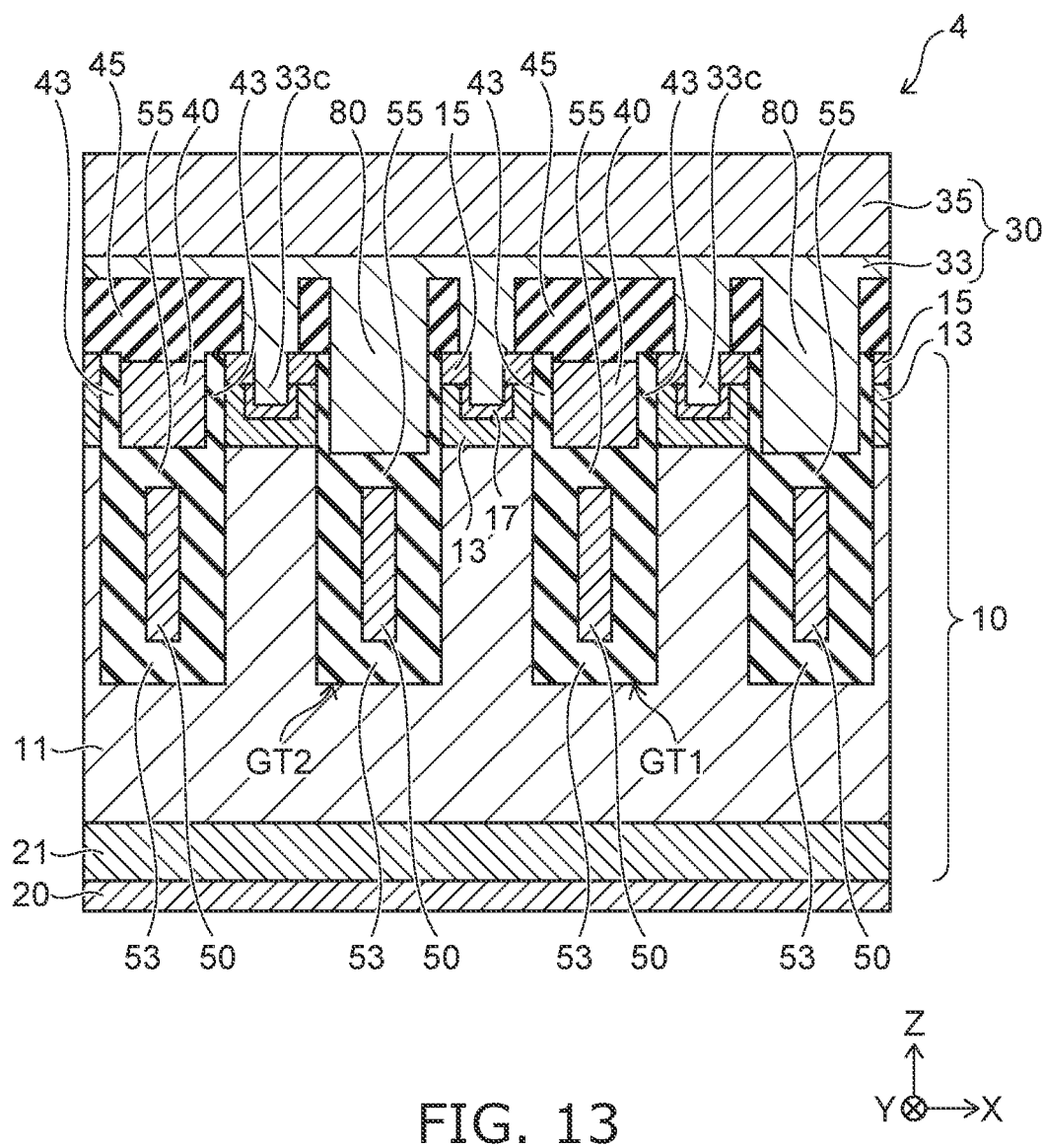
FIG. 13 is a schematic cross-sectional view showing a semiconductor device according to a third embodiment.

FIG. 13 is a schematic cross-sectional view showing a semiconductor device 4 according to a third embodiment. The semiconductor device 4 further includes a fourth electrode 80 instead of the insulating body 60. The fourth electrode 80 is provided in the upper portion of the second trench GT2. The fourth electrode 80 is, for example, electrically connected to the second electrode 30. The fourth electrode 80 includes, for example, tungsten and is linked to the first metal layer 33 of the second electrode 30. In the second trench GT2, the third electrode 50 is provided between the first electrode 20 and the fourth electrode 80. The insulating film 55 is provided between the third electrode 50 and the fourth electrode 80.

The fourth electrode 80 faces the second semiconductor layer 13 via the insulating film 43. The fourth electrode 80 is electrically insulated from the semiconductor part 10 by the insulating film 43. The second semiconductor layer 13 is positioned between the fourth electrode 80 and the control electrode 40 provided in the first trench GT1. The fourth electrode 80 has, For example, a thickness in the Z-direction greater than the thickness of the second semiconductor layer 13 in the Z-direction.

In the example, by providing the fourth electrode 80 inside the second trench GT2, the stress that is applied to the second semiconductor layer 13 also be increased, and the channel resistance can be reduced. The stress that is applied to the second semiconductor layer 13 also be controlled by the fourth electrode 80 in which a nitride film is added to the tungsten.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a first electrode;
a second electrode opposite to the first electrode;
a semiconductor part provided between the first electrode and the second electrode, the semiconductor part including first and second trenches next to each other in a front side of the semiconductor part, the front side facing the second electrode;

a third electrode provided inside the first trench, the third electrode being electrically insulated from the semiconductor part by a first insulating film;

a control electrode provided inside the first trench with the third electrode, a distance from the control electrode to the first electrode being greater than a distance from the third electrode to the first electrode, the control electrode being electrically insulated from the semiconductor part by a second insulating film, the control electrode being electrically insulated from the third electrode by a third insulating film, the control electrode being electrically insulated from the second electrode by a fourth insulating film;

another third electrode provided inside the second trench, said another third electrode being electrically insulated from the semiconductor part by another first insulating film; and an insulating body provided in the second trench between said another third electrode and the second electrode, no electrode being provided inside the second trench between said another third electrode and the second electrode, the semiconductor part including a first layer of a first conductivity type, a second layer of a second conductivity type, and a third layer of the first conductivity type, the first layer extending between the first electrode and the second electrode, the first layer including a portion positioned between the third electrode and said another third electrode, the second layer being provided between the first layer and the second electrode and between the control electrode and the insulating body, the third layer being provided between the second layer and the second electrode, the third layer contacting the second insulating film, the second layer and the third layer being electrically connected to the second electrode, wherein the first insulating film, the second insulating film, the third insulating film, and the insulating body each include silicon oxide, and the fourth insulating film includes a portion provided between the second electrode and the insulating body.

2. The device according to claim 1, wherein
the insulating body has a first thickness in a first direction, the first direction being directed from the first electrode toward the second electrode, and
the second layer of the semiconductor part has a second thickness in the first direction, the first thickness being greater than the second thickness.

3. The device according to claim 1, wherein
the insulating body includes a first insulating portion and a second insulating portion,
the first insulating portion is provided between the second insulating portion and the second layer of the semiconductor part,
the first insulating portion includes a same material as the first insulating film, and
the second insulating portion includes a different material from a material of the first insulating portion.

4. The device according to claim 3, wherein
the first insulating portion has a thickness in a second direction that is substantially equal to a thickness in the second direction of the first insulating film, the second direction being directed from the first trench toward the second trench.

5. The device according to claim 3, wherein
the insulating body further includes a third insulating portion,
the second insulating portion is provided between the second electrode and said another third electrode,
the third insulating portion is provided between the second insulating portion and said another third electrode, and
the third insulating portion includes a same material as a material of the third insulating film.

6. The device according to claim 3, wherein
the second insulating portion includes silicon oxide to which at least one of boron or phosphorus is added.

7. The device according to claim 3, wherein
the first insulating portion and the second insulating portion include silicon oxide, and
a density of silicon atoms in the second insulating portion is less than a density of silicon atoms in the first insulating portion.

8. The device according to claim 3, wherein
the insulating body further includes a third insulating portion,
the third insulating portion extends between the second electrode and said another third electrode and includes a same material as a material of the third insulating film, and
the second insulating portion is provided between the first insulating portion and the third insulating portion in second direction, the second direction being directed from the first trench toward the second trench.

9. The device according to claim 8, wherein
the first insulating portion has a thickness in the second direction, the thickness of the first insulating portion being less than a thickness in the second direction of the first insulating film.

* * * * *